(12) United States Patent
Dahilig et al.

(10) Patent No.: US 8,518,749 B2
(45) Date of Patent: Aug. 27, 2013

(54) SEMICONDUCTOR DEVICE AND METHOD OF FORMING PREFABRICATED HEAT SPREADER FRAME WITH EMBEDDED SEMICONDUCTOR DIE

(75) Inventors: Frederick R. Dahilig, Singapore (SG); Zigmund R. Camacho, Singapore (SG); Lionel Chien Hui Tay, Singapore (SG); Dioscoro A. Merilo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 362 days.

(21) Appl. No.: 12/489,177

(22) Filed: Jun. 22, 2009

(65) Prior Publication Data
US 2010/0320588 A1 Dec. 23, 2010

(51) Int. Cl.
*H01L 21/00* (2006.01)
*H01L 23/34* (2006.01)

(52) U.S. Cl.
USPC .... 438/122; 438/124; 257/720; 257/E23.101; 257/E21.502

(58) Field of Classification Search
USPC ............. 257/690, 720, E23.101, E23.01, 257/E21.502, E21.585; 438/122, 124
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,358,826 A * | 10/1994 | Steitz et al. | 430/312 |
| 5,841,193 A | 11/1998 | Eichelberger | |
| 6,639,324 B1 * | 10/2003 | Chien | 257/778 |
| 6,709,898 B1 | 3/2004 | Ma et al. | |
| 6,713,859 B1 | 3/2004 | Ma | |
| 7,011,988 B2 | 3/2006 | Forcier | |
| 7,019,406 B2 | 3/2006 | Huang et al. | |
| 7,205,674 B2 * | 4/2007 | Huang et al. | 257/787 |
| 7,364,944 B2 | 4/2008 | Huang et al. | |
| 7,387,911 B2 | 6/2008 | Audette et al. | |
| 7,619,901 B2 | 11/2009 | Eichelberger et al. | |
| 2004/0106291 A1 | 6/2004 | Ho et al. | |
| 2004/0155325 A1 * | 8/2004 | Ma et al. | 257/678 |
| 2005/0269700 A1 * | 12/2005 | Farnworth et al. | 257/737 |
| 2006/0046347 A1 * | 3/2006 | Wood et al. | 438/106 |
| 2006/0256525 A1 * | 11/2006 | Shim et al. | 361/697 |
| 2007/0114677 A1 * | 5/2007 | Kwon et al. | 257/796 |
| 2007/0166867 A1 * | 7/2007 | Chow et al. | 438/65 |
| 2007/0210443 A1 * | 9/2007 | Merilo et al. | 257/704 |
| 2007/0212812 A1 | 9/2007 | Chow et al. | |
| 2008/0036482 A1 * | 2/2008 | Tomita et al. | 324/755 |
| 2008/0212288 A1 | 9/2008 | Kang et al. | |
| 2009/0026606 A1 * | 1/2009 | Chen | 257/712 |
| 2010/0148357 A1 * | 6/2010 | Yang et al. | 257/713 |

* cited by examiner

*Primary Examiner* — Matthew Landau
*Assistant Examiner* — Khaja Ahmad
(74) *Attorney, Agent, or Firm* — Robert D. Atkins; Patent Law Group: Atkins & Associates, P.C.

(57) ABSTRACT

A semiconductor device is made by mounting a prefabricated heat spreader frame over a temporary substrate. The heat spreader frame includes vertical bodies over a flat plate. A semiconductor die is mounted to the heat spreader frame for thermal dissipation. An encapsulant is deposited around the vertical bodies and semiconductor die while leaving contact pads on the semiconductor die exposed. The encapsulant can be deposited using a wafer level direct/top gate molding process or wafer level film assist molding process. An interconnect structure is formed over the semiconductor die. The interconnect structure includes a first conductive layer formed over the semiconductor die, an insulating layer formed over the first conductive layer, and a second conductive layer formed over the first conductive layer and insulating layer. The temporary substrate is removed, dicing tape is applied to the heat spreader frame, and the semiconductor die is singulated.

27 Claims, 8 Drawing Sheets

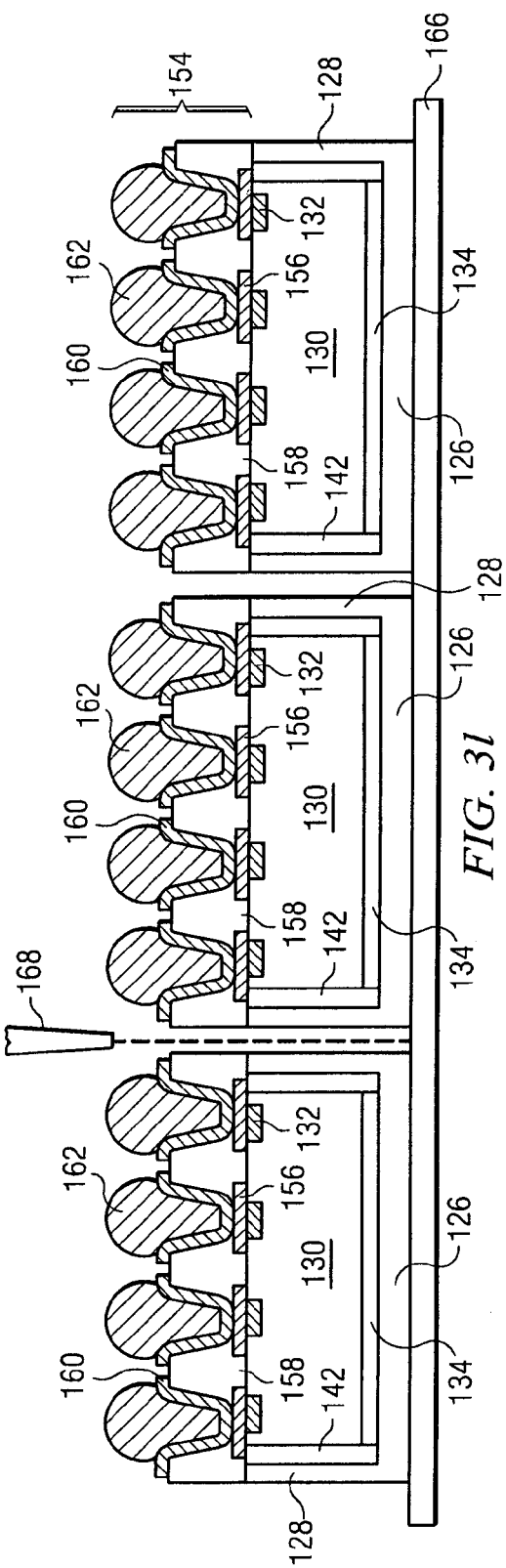
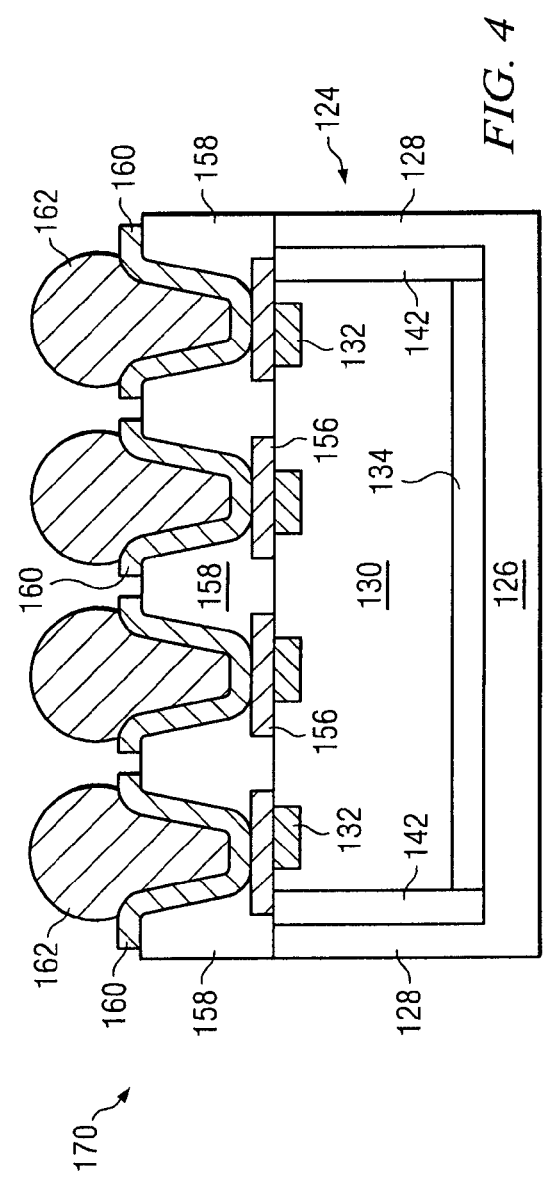

SEMICONDUCTOR DEVICE AND METHOD OF FORMING PREFABRICATED HEAT SPREADER FRAME WITH EMBEDDED SEMICONDUCTOR DIE

FIELD OF THE INVENTION

The present invention relates in general to semiconductor devices and, more particularly, to a wafer level package and method of embedding a semiconductor die in a prefabricated heat spreader frame for thermal dissipation.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. An increase in device performance can be accomplished by forming active components that are capable of operating at higher speeds. In some high-performance semiconductor devices, a large number of digital circuits operate with a high frequency clock, e.g., a microprocessor operating in gigahertz range. In other high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

These high-performance semiconductor devices generate significant heat which must be adequately dissipated. Some semiconductor packages use the encapsulant or build-up interconnect structures to dissipate heat. However, encapsulant or build-up interconnect structures are typically poor thermal conductors. Without effective heat dissipation, the generated heat can reduce performance, decrease reliability, and reduce the useful lifetime of the semiconductor device. In addition, warpage due to differential thermal expansion coefficient between the semiconductor die and build-up interconnect structures can cause die stress and delamination. Mechanical stress is also present along the die sidewalls.

SUMMARY OF THE INVENTION

A need exists to dissipate heat from a semiconductor die in a wafer level package and reduce mechanical stress. Accordingly, in one embodiment, the present invention is a method of making a semiconductor device comprising the steps of providing a temporary substrate, mounting a prefabricated heat spreader frame over the temporary substrate, mounting a semiconductor die to the heat spreader frame for thermal dissipation, depositing an encapsulant over the semiconductor die and heat spreader frame while leaving contact pads on the semiconductor die exposed, and forming an interconnect structure over the semiconductor die.

In another embodiment, the present invention is a method of making a semiconductor device comprising the steps of providing a heat spreader frame, mounting a semiconductor die to the heat spreader frame for thermal dissipation, depositing an encapsulant over the semiconductor die and heat spreader frame, and forming an interconnect structure over the semiconductor die.

In another embodiment, the present invention is a method of making a semiconductor device comprising the steps of providing a wafer-shaped temporary substrate, mounting a wafer-shaped heat spreader frame over the temporary substrate, mounting a semiconductor die to the heat spreader frame for thermal dissipation, depositing an encapsulant over the semiconductor die and heat spreader frame, and forming an interconnect structure over the semiconductor die.

In another embodiment, the present invention is a semiconductor device comprising a heat spreader frame and semiconductor die mounted to the heat spreader frame for thermal dissipation. An encapsulant is deposited over the semiconductor die and heat spreader frame. An interconnect structure is formed over the semiconductor die.

BRIEF DESCRIPTION OF THE DRAWINGS

FIGS. 3a-3l illustrate a process of forming wafer level heat spreader frame with embedded semiconductor die; and FIG. 4 illustrates an individual wafer level package with semiconductor die embedded in the heat spreader frame.

DETAILED DESCRIPTION OF THE DRAWINGS

Figure 1:
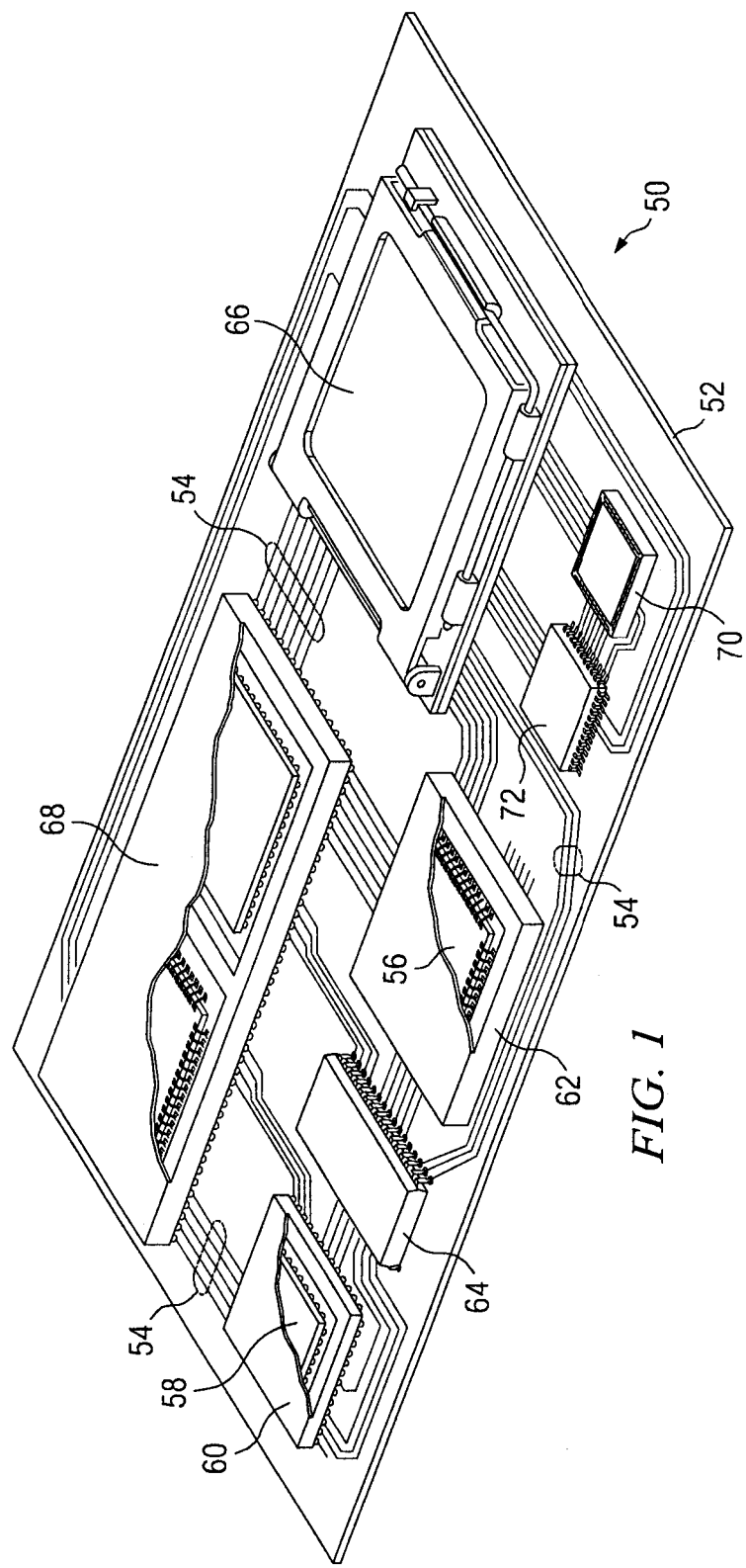
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
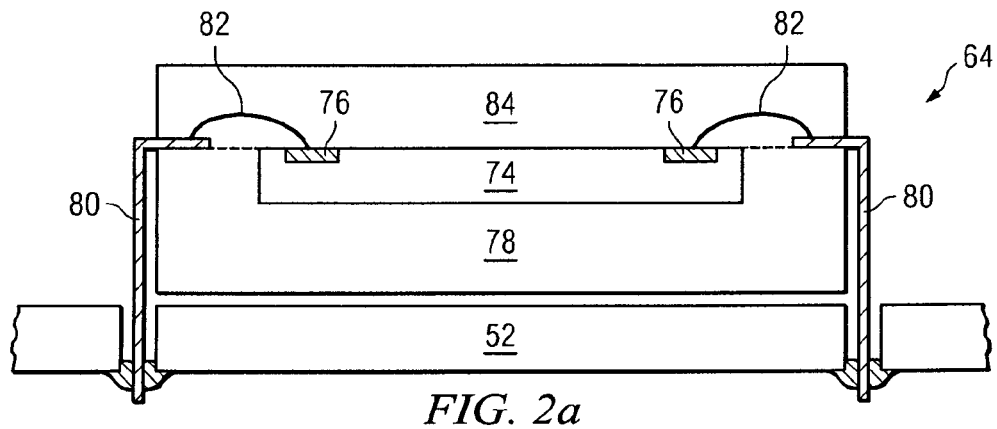
FIGS. 2a-2c illustrate further detail of the representative semiconductor packages mounted to the PCB.
Figure 2B:
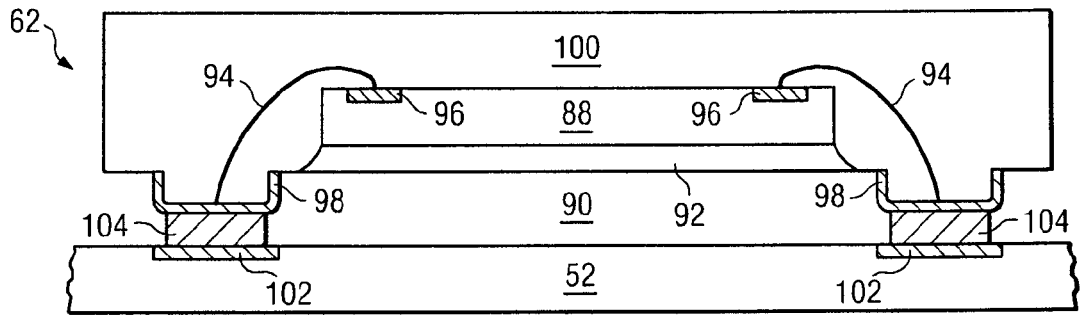
Figure 2C:
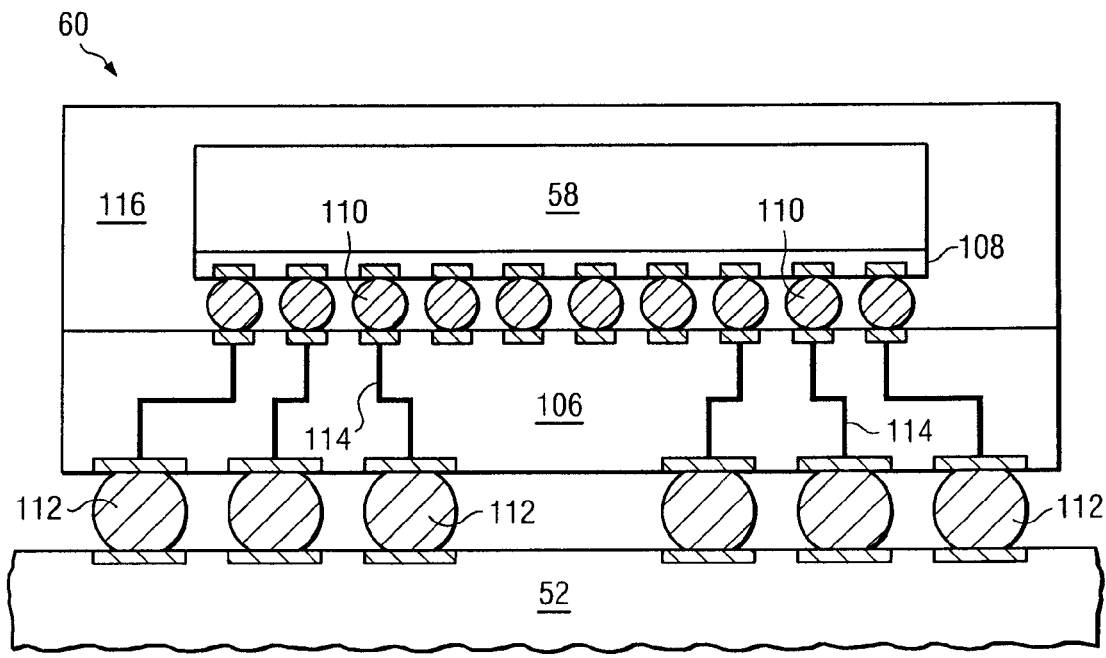

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
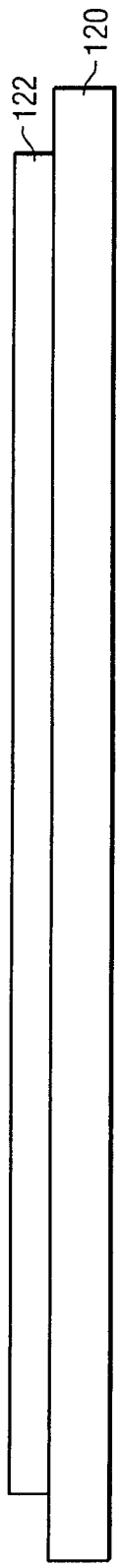

FIGS. 3a-3l illustrate a process of forming a prefabricated heat spreader frame for thermally enhancing an embedded semiconductor die in a wafer level chip scale package (WLCSP). In FIG. 3a, a sacrificial or temporary wafer level substrate or carrier 120 contains a base material such as silicon, polymer, polymer composite, metal foil, ceramic, glass, glass epoxy, beryllium oxide, tape, or other suitable low-cost, rigid material for structural support. Carrier 120 is wafer-shaped or circular with a diameter of 15-30 centimeters (cm). An adhesive film or layer 122 is formed over carrier 120. Adhesive layer 122 can be a flexible plastic base film, such as polyvinyl chloride (PVC) or polyolefin, with a synthetic acrylic adhesive or ultraviolet (UV)-sensitive adhesive, for device mounting and removal. Adhesive layer 122 is releasable by light, heat, laser, or mechanical pressure. Alternatively, an adhesive material such as thermal epoxy, polymer composite or inorganic bonding compounds, can be applied to carrier 120.

Figure 3B:
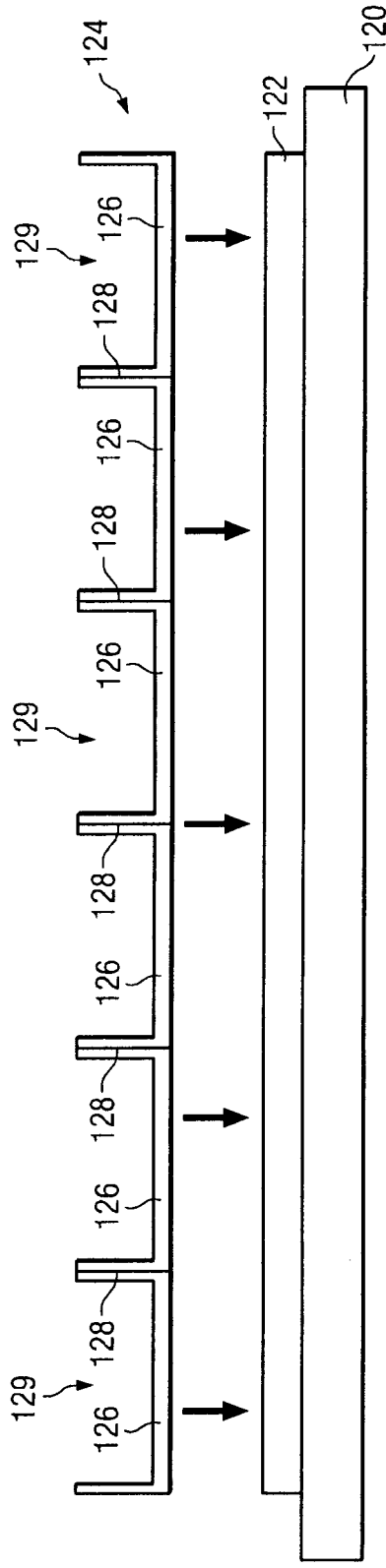
Figure 3C:
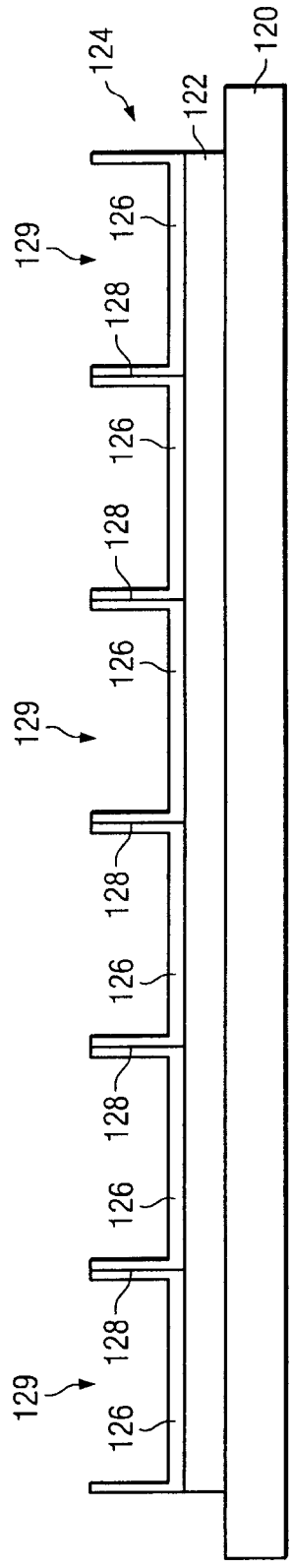
Figure 3D:
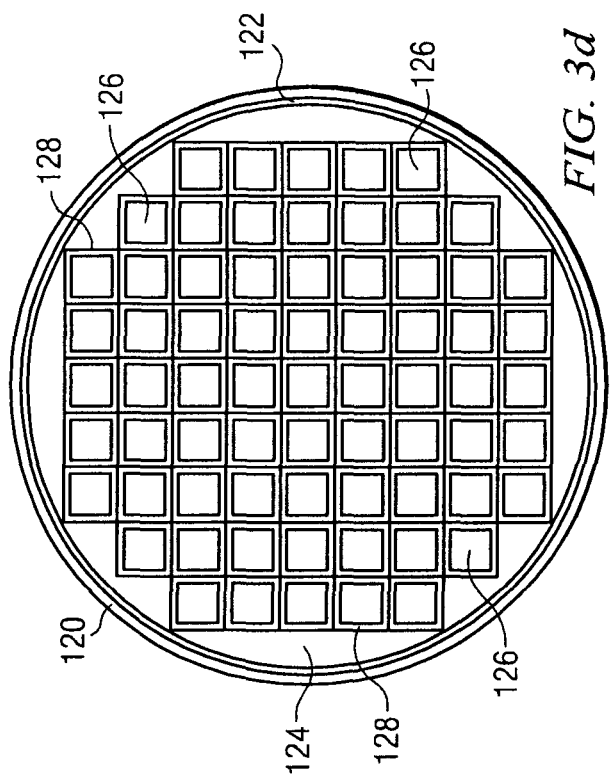

A prefabricated heat spreader frame 124 is mounted to carrier 120 with adhesive layer 122, as shown in FIGS. 3b and 3c. Heat spreader frame 124 has a similar wafer-shape or form factor as carrier 120, as shown in FIG. 3d. Head spreader 124 can be prefabricated using a leadframe manufacturing process to reduce manufacturing costs. Heat spreader frame 124 includes a flat plate 126 with a plurality of bodies 128 extending vertically from plate 126. The bodies 128 form cavities or recessed openings 129. Cavities 129 serve as semiconductor die mounting sites. The center portion of heat spreader frame 124 can be punched for die mounting. Heat spreader frame 124 can be Cu, Al, Au, Ag, or other metals and composites capable of dissipating heat. Heat spreader frame 124 may also contain thermal fillers such as alumina ($Al_2O_3$), zinc oxide (ZnO), Ag, or aluminum nitride (AlN).

Figure 3E:
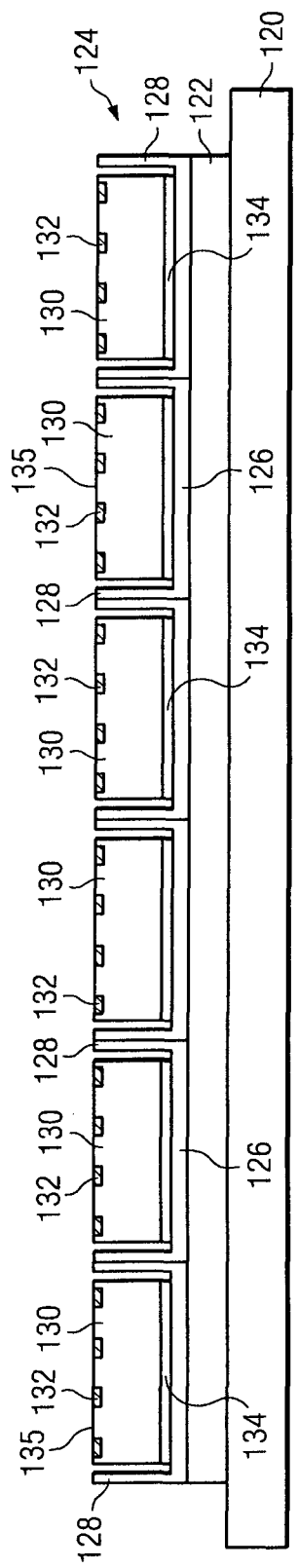

In FIG. 3e, a plurality of semiconductor die 130 with contact pads 132 oriented upward is placed into cavities 129 and secured with die attach adhesive 134, such as a pre-cut adhesive film, dispensed epoxy, thermal gelease, thermal grease, or other suitable adhesive. Each semiconductor die 130 includes an active surface 135 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 135 to implement baseband analog circuits or digital circuits, such as digital signal processor (DSP), ASIC, memory, or other signal processing circuit. Semiconductor die 130 may also contain IPD, such as inductors, capacitors, and resistors, for RF signal processing. A typical RF system requires multiple IPDs in one or more semiconductor packages to perform the necessary electrical functions.

Semiconductor die 130, particularly high performance digital circuits and IPD, inherently generate heat during normal operation which must be properly dissipated. Heat spreader frame 124, including plate 126 and bodies 128, serve to dissipate heat from semiconductor die 130. In one embodiment, heat spreader frame 124 has a thermal conductivity ranging from 90-430 W/m-K.

Figure 3F:
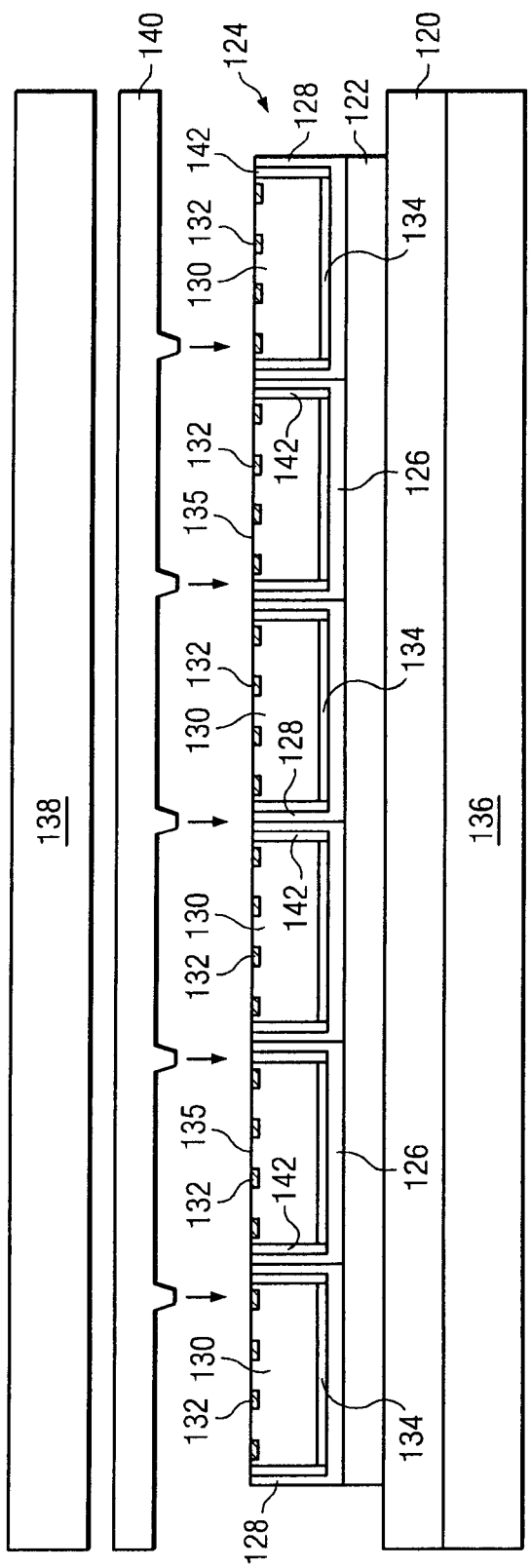

In FIG. 3f, carrier 120, with heat spreader frame 124 and embedded semiconductor die 130, is disposed between bottom chase 136 and top chase 138 for wafer level encapsulation. In a direct/top gate molding process, center plate 140 injects molding compound or encapsulant 142 over heat spreader frame 124 and around embedded semiconductor die 130. Encapsulant 142 can be polymer composite material, such as epoxy resin with filler, epoxy acrylate with filler, or polymer with proper filler. The direct gate molding process provides good encapsulation coverage on each die and leaves contact pads 132 exposed post encapsulation for electrical connection to a subsequent build-up interconnect structure, without further etching. Alternatively, a paste printing, compressive molding, transfer molding, liquid encapsulant molding, vacuum lamination, or other suitable applicator can be used to dispense encapsulant 142. Encapsulant 142 is non-conductive and environmentally protects the semiconductor device from external elements and contaminants.

Figure 3G:
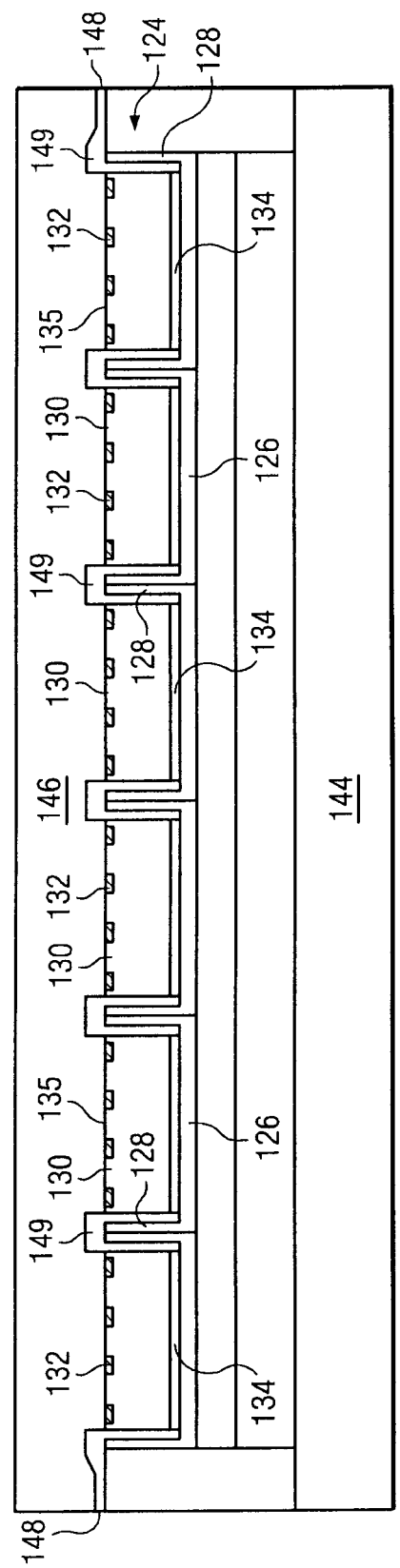

FIG. 3g shows an alternate wafer level film assist encapsulation process with carrier 120, with heat spreader frame 124 and embedded semiconductor die 130, disposed between bottom chase 144 and top chase 146. A molding compound or encapsulant 149 is injected through ports 148 over heat spreader frame 124 and around embedded semiconductor die 130. Encapsulant 149 can be polymer composite material, such as epoxy resin with filler, epoxy acrylate with filler, or polymer with proper filler. Top chase 146 physically contacts active surface 135 and isolates contact pads 132 during encapsulation. The wafer level film assist molding process provides good encapsulation coverage on each die and leaves contact pads 132 exposed post encapsulation for electrical connection to a subsequent build-up interconnect structure, without further etching.

Figure 3H:
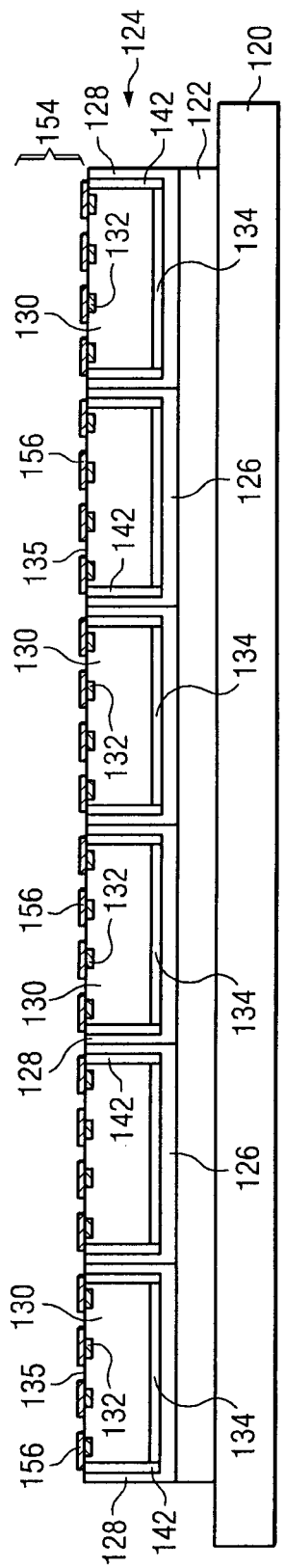

In FIG. 3h, a topside build-up interconnect structure 154 is formed over semiconductor die 130. The build-up interconnect structure 154 includes an electrically conductive layer 156 formed in sections or portions using patterning and PVD, CVD, electrolytic plating, electroless plating process, or other suitable metal deposition process. Conductive layer 156 can be one or more layers of Al, Cu, Sn, Ni, Au, Ag, or other suitable electrically conductive material. The portions of conductive layer 156 electrically connect to contact pads 132 and can be electrically common or electrically isolated depending on the design and function of the semiconductor die.

Figure 3I:
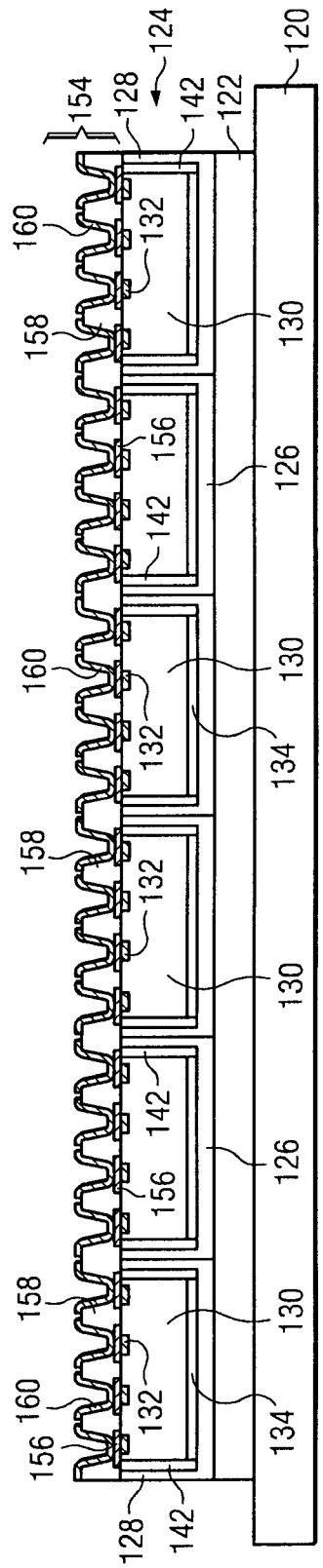

In FIG. 3i, an insulating or passivation layer 158 is formed over conductive layer 156. The insulating layer 158 can be one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 158 is deposited using PVD, CVD, printing, spin coating, spray coating, sintering or thermal oxidation. A portion of insulating layer 158 is removed by an etching process to expose conductive layer 156.

An electrically conductive layer 160 formed over insulating layer 158 and conductive layer 156 in sections or portions using patterning and PVD, CVD, electrolytic plating, electroless plating process, or other suitable metal deposition process. Conductive layer 160 can be one or more layers of Al, Cu, Sn, Ni, Au, Ag, or other suitable electrically conductive material. One portion of conductive layer 160 electrically connects to conductive layer 156. Other portions of conductive layer 160 can be electrically common or electrically isolated depending on the design and function of the semiconductor device.

In one embodiment, conductive layer 160 is an under bump metallization (UBM) layer made with multi-metal stack including an adhesion layer, barrier layer, and seed or wetting layer. The adhesion layer can be Ti, titanium nitride (TiN), titanium tungsten (TiW), Al, or chromium (Cr). The barrier layer is formed over the adhesion layer and can be made of Ni, nickel vanadium (NiV), platinum (Pt), palladium (Pd), TiW, or chromium copper (CrCu). The barrier layer inhibits the diffusion of Cu into active area 135 of semiconductor die 130. The seed layer can be Cu, Ni, NiV, Au, or Al. The seed layer is formed over the barrier layer. UBM 160 provides a low resistive interconnect, as well as a barrier to solder diffusion and seed layer for solder wettability.

Figure 3J:
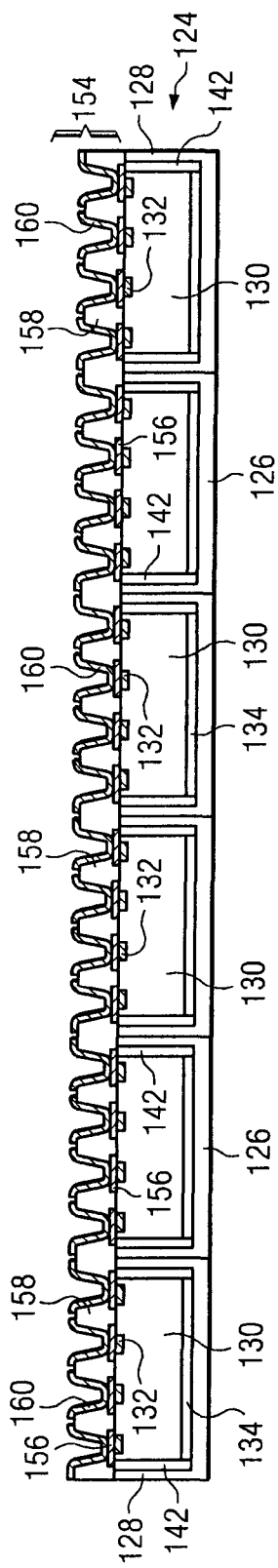

In FIG. 3j, carrier 120 and adhesive layer 122 are removed from heat spreader frame 124 by light, heat, laser, or mechanical pressure. For example, carrier 120 and adhesive layer 122 can be removed by UV-light, thermal detach, chemical etching, mechanical peel-off, CMP, mechanical grinding, wet stripping, or other suitable detachment process.

Figure 3K:
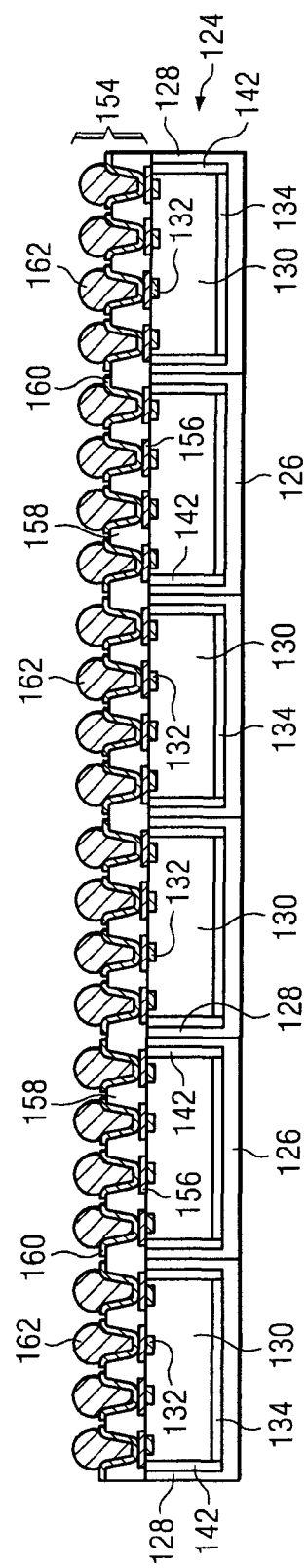

In FIG. 3k, an electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form spherical balls or bumps 162. In some applications, bumps 162 are reflowed a second time to improve electrical contact to conductive layer 160. The bumps can also be compression bonded to conductive layer 160. Bumps 162 represent one type of interconnect structure that can be formed over conductive layer 160. The interconnect structure can also use bond wires, conductive paste, stud bump, micro bump, or other electrical interconnect.

In FIG. 3l, dicing tape 166 is applied to heat spreader frame 124 for structural support during singulation. Semiconductor die 130 are then singulated with saw blade or laser cutting tool 168 into individual semiconductor devices 170, as shown in FIG. 4. Semiconductor device 170 is a WLCSP with heat spreader frame 124 for thermally enhancing embedded semiconductor die 130 which is electrically connected to build-up interconnect structure 154 for further package integration. Heat spreader frame 124 provides for dissipation of heat generated by semiconductor die 130. Bodies 128 of heat spreader frame 124 protect the sidewalls of semiconductor die 130 from mechanical stress after dicing/singulation as well as during further device integration, e.g., PCB mounting. Heat spreader frame 124 also serves as a wafer stiffener to reduce wafer warpage during the manufacturing process, particularly during the encapsulation process.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of manufacturing a semiconductor device, comprising:
   providing a prefabricated heat spreader frame including a flat plate with a plurality of bodies extending from the flat plate to form a plurality of die mounting sites on the flat plate;
   disposing a plurality of semiconductor die over the die mounting sites on the flat plate in the prefabricated heat spreader frame for thermal dissipation;
   providing a chase mold including a center plate;
   placing the prefabricated heat spreader frame and semiconductor die in the chase mold;
   depositing an encapsulant from the center plate of the chase mold over the semiconductor die and prefabricated heat spreader frame while leaving contact pads on the semiconductor die devoid of the encapsulant;
   forming an interconnect structure over the semiconductor die; and
   singulating the bodies of the prefabricated heat spreader frame to separate the semiconductor die.

2. The method of claim 1, wherein forming the interconnect structure includes:
   forming a first conductive layer over the semiconductor die;
   forming an insulating layer over the first conductive layer; and
   forming a second conductive layer over the first conductive layer.

3. The method of claim 2, wherein forming the interconnect structure further includes forming a bump over the second conductive layer.

4. A method of manufacturing a semiconductor device, comprising:
   providing a prefabricated heat spreader frame including a plurality of die mounting sites;
   disposing a plurality of semiconductor die over the die mounting sites in the prefabricated heat spreader frame;
   placing the prefabricated heat spreader frame and semiconductor die in a chase mold;
   depositing an encapsulant over the semiconductor die and prefabricated heat spreader frame while in the chase mold to leave contact pads on the semiconductor die devoid of the encapsulant; and
   forming an interconnect structure over the semiconductor die.

5. The method of claim 4, wherein the prefabricated heat spreader frame includes vertical bodies over a flat plate.

6. The method of claim 4, further including depositing the encapsulant using a wafer level direct/top gate molding process.

7. The method of claim 4, further including depositing the encapsulant using a wafer level film assist molding process.

8. The method of claim 4, wherein forming the interconnect structure includes:
   forming a first conductive layer over the semiconductor die;
   forming an insulating layer over the first conductive layer; and
   forming a second conductive layer over the first conductive layer.

9. A method of manufacturing a semiconductor device, comprising:
   providing a wafer-shaped carrier;
   mounting a wafer-shaped heat spreader frame including a plurality of die mounting sites over the wafer-shaped carrier;
   disposing a plurality of semiconductor die over the die mounting sites of the wafer-shaped heat spreader frame; and
   depositing an encapsulant over the semiconductor die and wafer-shaped heat spreader frame while leaving contact pads on the semiconductor die devoid of the encapsulant.

10. The method of claim 9, wherein the wafer-shaped heat spreader frame includes vertical bodies over a flat plate.

11. The method of claim 9, further including depositing the encapsulant using a wafer level direct/top gate molding process.

12. The method of claim 9, further including depositing the encapsulant using a wafer level film assist molding process.

13. The method of claim 9, further including:
   removing the wafer-shaped carrier; and
   applying dicing tape to the wafer-shaped heat spreader frame.

14. The method of claim 9, wherein forming the interconnect structure includes:
   forming a first conductive layer over the semiconductor die;
   forming an insulating layer over the first conductive layer; and
   forming a second conductive layer over the first conductive layer.

15. A semiconductor device, comprising:
   a prefabricated heat spreader frame including a plurality of die mounting sites;
   a plurality of semiconductor die disposed over the die mounting sites in the prefabricated heat spreader frame;
   a chase mold for housing the semiconductor and prefabricated heat spreader frame;
   an encapsulant deposited over the semiconductor die and prefabricated heat spreader frame while in the chase mold to leave contact pads on the semiconductor die devoid of the encapsulant; and
   an interconnect structure formed over the semiconductor die.

16. The semiconductor device of claim 15, wherein the prefabricated heat spreader frame includes vertical bodies over a flat plate.

17. The semiconductor device of claim 15, wherein the interconnect structure includes:
   a first conductive layer formed over the semiconductor die;
   an insulating layer formed over the first conductive layer; and
   a second conductive layer formed over the first conductive layer.

18. A method of manufacturing a semiconductor device, comprising:
   providing a prefabricated heat spreader frame including a plurality of die mounting sites;
   mounting a plurality of semiconductor die to the die mounting sites in the prefabricated heat spreader frame;
   placing the prefabricated heat spreader frame and semiconductor die in a chase mold; and depositing an encapsulant over the semiconductor die and prefabricated heat spreader frame while in the chase mold.

19. The method of claim 18, wherein the prefabricated heat spreader frame includes vertical bodies over a flat plate.

20. The method of claim 18, further including depositing the encapsulant using a wafer level direct/top gate molding process.

21. The method of claim 18, further including depositing the encapsulant using a wafer level film assist molding process.

22. The method of claim 18, wherein forming the interconnect structure includes:
   forming a first conductive layer over the semiconductor die;
   forming an insulating layer over the first conductive layer; and
   forming a second conductive layer over the first conductive layer.

23. The method of claim 18, further including forming an interconnect structure over the semiconductor die.

24. The method of claim 18, further including singulating the prefabricated heat spreader frame to separate the semiconductor die.

25. The method of claim 4, further including singulating the prefabricated heat spreader frame to separate the semiconductor die.

26. The method of claim 9, further including forming an interconnect structure over the semiconductor die.

27. The method of claim 9, further including singulating the prefabricated heat spreader frame to separate the semiconductor die.

* * * * *